(12) United States Patent
Park et al.

(10) Patent No.: US 7,724,579 B2
(45) Date of Patent: May 25, 2010

(54) SEMICONDUCTOR MEMORY DEVICES AND METHOD FOR PREVENTING MISMATCH OF REFERENCE SIGNALS IN DATA SENDING

(75) Inventors: Sang-Kug Park, Bucheon (KR); Dae-Han Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 231 days.

(21) Appl. No.: 11/892,461

(22) Filed: Aug. 23, 2007

(65) Prior Publication Data

US 2008/0151635 A1 Jun. 26, 2008

(30) Foreign Application Priority Data

Dec. 26, 2006 (KR) .................. 10-2006-0133623

(51) Int. Cl.
*G11C 11/34* (2006.01)
(52) U.S. Cl. .............................. 365/185.21; 365/185.2; 365/189.09
(58) Field of Classification Search .............. 365/185.2, 365/185.21, 189.09
See application file for complete search history.

(56) References Cited

U.S. PATENT DOCUMENTS

| | | | |
|---|---|---|---|
| 6,269,040 B1 * | 7/2001 | Reohr et al. ............. | 365/210.1 |
| 6,438,038 B2 * | 8/2002 | Ikehashi et al. ......... | 365/185.24 |
| 6,507,523 B2 * | 1/2003 | Pekny .................... | 365/189.09 |
| 2006/0056216 A1 * | 3/2006 | Rhelimi ................. | 365/63 |

FOREIGN PATENT DOCUMENTS

| | | |
|---|---|---|
| JP | 08-190797 | 7/1996 |
| JP | 2001-028196 | 1/2001 |
| JP | 2004-103181 | 4/2004 |
| KR | 10-2001-0065281 | 7/2001 |
| KR | 10-2003-0035171 | 5/2003 |

OTHER PUBLICATIONS

Korean Notice to Submit Response dated Feb. 27, 2008.

* cited by examiner

*Primary Examiner*—Tuan T Nguyen
*Assistant Examiner*—R Lance Reidlinger
(74) *Attorney, Agent, or Firm*—Harness, Dickey & Pierce, P.L.C.

(57) ABSTRACT

Semiconductor memory devices and a method thereof are provided. An example semiconductor memory device may include a control signal generation unit configured to generate a plurality of control signals in response to a bias current, a reference current generation unit configured to generate a reference current in response to the plurality of control signals and a sense amplifier configured to sense and amplify data stored in a given memory cell based on the reference current and a current on a bit line connected to the memory cell. Another example semiconductor memory device may include a memory bank including a plurality of memory cells and a sense amplifier bank including a plurality of sense amplifier units sharing a common line, each of the sense amplifier units including a current source configured to form a current path between the common line and a first voltage supply in response to an enable signal and a gating signal and a sense amplifier configured to sense and amplify data stored in a corresponding memory cell among the plurality of memory cells based on a signal on a bit line connected with the corresponding memory cell and a signal on the common line.

8 Claims, 10 Drawing Sheets

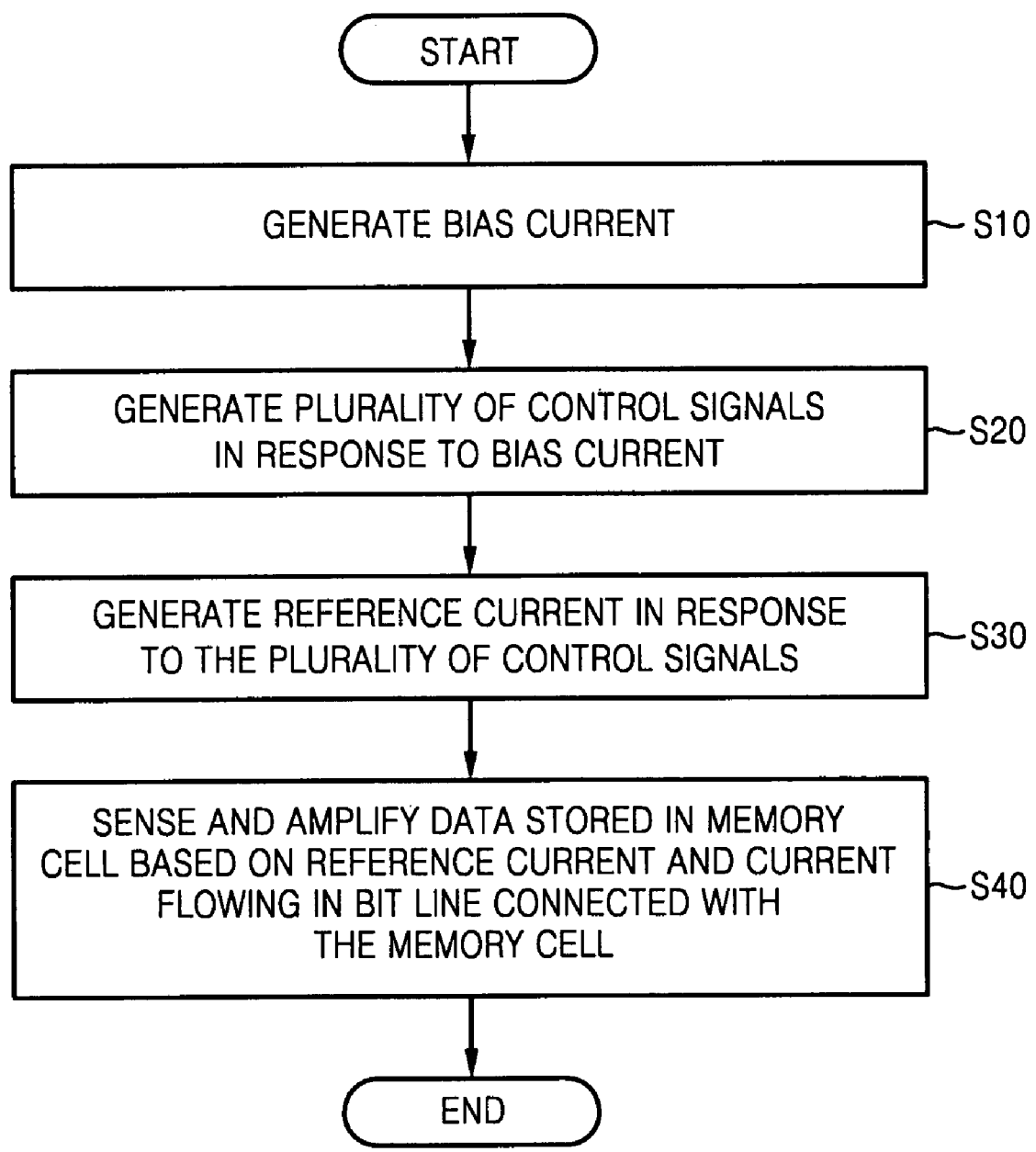

SEMICONDUCTOR MEMORY DEVICES AND METHOD FOR PREVENTING MISMATCH OF REFERENCE SIGNALS IN DATA SENDING

PRIORITY STATEMENT

This application claims priority under 35 U.S.C. §119 from Korean Patent Application No. 10-2006-0133623, filed on Dec. 26, 2006, the entire contents of which are hereby incorporated by reference.

BACKGROUND

1. Field

Example embodiments relate generally to semiconductor memory devices and a method thereof.

2. Description of the Related Art

Conventional non-volatile memory devices may include mask read only memory (ROM), electrically erasable and programmable ROM (EEPROM), and erasable and programmable ROM (EPROM). Flash EEPROM (hereinafter, referred to as a "flash memory device") may have a relatively high degree of integration as compared to other EEPROMs. Flash memory devices may include NAND flash memory devices, NOR flash memory devices and AND flash memory devices. NAND flash memory devices have a relatively high degree of integration and may be used for storing data. NOR flash memory devices may have a relatively fast data access speed and may be for storing program codes.

FIG. 1 illustrates a conventional semiconductor memory device 10 including a sense amplifier. Referring to FIG. 1, the semiconductor memory device 10 (e.g., a NOR flash memory device) may include a plurality of memory banks 20, 30 and 40, a plurality of control signal generators 21, 25, 31, 35, 41, and 45, a plurality of sense amplifier banks 23, 27, 33, 37, 43, and 47, a first reference cell group 50 and a second reference cell group 60.

Referring to FIG. 1, the first memory bank 20 may include at least one memory cell. The first control signal generator 21 may generate a first control signal REF0 in response to a first reference current Ir1 flowing in the first reference cell group 50. The at least one memory cell may be implemented by flash EEPROM.

Referring to FIG. 1, the first sense amplifier bank 23 may include at least one first sense amplifier (not shown). The first sense amplifier may sense data stored in a first memory cell (not shown) included in the first memory bank 20 based on a first current, which may flow in a first bit line (not shown) connected with the first memory cell, and a second current, which may be generated in response to the first control signal REF0.

Referring to FIG. 1, a magnitude of the second current may depend on a swing width of the first control signal REF0. If the first current is greater than the second current, the first sense amplifier may output a first logic level (e.g., a higher logic level or logic "1"). If the first current is not greater than the second current, the first sense amplifier may output a second logic level (e.g., a lower logic level or logic "0").

Referring to FIG. 1, the second control signal generator 25 may generate a second control signal REF1 in response to a second reference current Ir2 flowing in the second reference cell group 60. The second sense amplifier bank 27 may include at least one second sense amplifier (not shown). The second sense amplifier may sense data stored in a second memory cell (not shown) included in the first memory bank 20 based on a third current, which may flow in a second bit line (not shown) connected with the second memory cell, and a fourth current, which may be generated in response to the second control signal REF1.

Referring to FIG. 1, a magnitude of the fourth current may depend on a swing width of the second control signal REF1. If the fourth current is greater than the third current, the second sense amplifier may output the first logic level (e.g., a higher logic level or logic "1"). If the fourth current is not greater than the third current, the second sense amplifier may output the second logic level (e.g., a lower logic level or logic "0").

Referring to FIG. 1, the first reference cell group 50 may include at least one memory cell including a source, a drain, a floating gate, a control gate, and a substrate. The first reference cell group 50 may generate the first reference current Ir1 in response to a reference current generation signal Ref. The second reference cell group 60 may include at least one memory cell including a source, a drain, a floating gate, a control gate, and a substrate. The second reference cell group 60 may generate the second reference current Ir2 in response to the reference current generation signal Ref.

Referring to FIG. 1, if the magnitude of the first reference current Ir1 is equal to that of the second reference current Ir2, the first control signal REF0 may be the same as the second control signal REF1 and currents (e.g., the second current and the fourth current), which may be respectively used as references if data in memory cells (e.g., the first memory cell and the second memory cell) are sensed, may likewise be the same.

However, if the magnitudes of the first and second reference currents Ir1 and Ir2 are not equal to each other, the first control signal REF0 may not be the same as the second control signal REF1 and the currents, which may be respectively used as references if data in the memory cells are sensed, may not necessarily be the same. Accordingly, data stored in the memory cells may not be reliably or consistently sensed.

For example, the first control signal REF0 and the second control signal REF1 may be generated based on currents flowing in different reference cells (e.g., the first reference cell group 50 and the second reference cell group 60), respectively, and therefore, it may be difficult to match the first control signal REF0 and the second control signal REF1. In addition, the first control signal REF0 input to a sense amplifier, which may be positioned relatively far away from the first control signal generator 21 among a plurality of sense amplifiers included in the first sense amplifier bank 23, may be distorted, and therefore, data stored in memory cells may not be reliably sensed.

In another example, because multi-level cell (MLC) flash memory may have a relatively small read margin, matching between reference currents generated in different reference cells may be an important design criterion. For example, each of memory cells in the MLC flash memory may identify one of four data states (e.g., "11", "10", "01", and "00") based on a reference current during a data read operation, and therefore, data sensing of memory cells may relatively unreliable if the reference currents of the memory cells are not substantially the same during the data sensing.

SUMMARY OF EXAMPLE EMBODIMENTS

An example embodiment is directed to a semiconductor memory device, including a control signal generation unit configured to generate a plurality of control signals in response to a bias current, a reference current generation unit configured to generate a reference current in response to the plurality of control signals and a sense amplifier configured to sense and amplify data stored in a given memory cell based on the reference current and a current on a bit line connected to the memory cell.

Another example embodiment is directed to a semiconductor memory device, including a memory bank including a plurality of memory cells and a sense amplifier bank including a plurality of sense amplifier units sharing a common line, each of the sense amplifier units including a current source configured to form a current path between the common line and a first voltage supply in response to an enable signal and a gating signal and a sense amplifier configured to sense and amplify data stored in a corresponding memory cell among the plurality of memory cells based on a signal on a bit line connected with the corresponding memory cell and a signal on the common line.

Another example embodiment is directed to a method of sensing data, including generating a bias current, generating a plurality of control signals in response to the bias current, generating a reference current in response to the plurality of control signals and sensing data stored in a memory cell based on the reference current and a current on a bit line connected with the memory cell.

Another example embodiment is directed to a semiconductor memory device and data sensing method for reducing and/or preventing a mismatch of reference signals input to a plurality of sense amplifiers, respectively.

Another example embodiment is directed to a semiconductor memory device and data sensing method for enabling data sensing to be accurately performed even if a defect occurs in one or more of a plurality of reference current generation units.

BRIEF DESCRIPTION OF THE DRAWINGS

Detailed illustrative example embodiments are disclosed herein. However, specific structural and functional details disclosed herein are merely representative for purposes of describing example embodiments. Example embodiments may, however, be embodied in many alternate forms and should not be construed as limited to the embodiments set forth herein.

FIG. 10 is a flowchart illustrating a data sensing process according to an example embodiment.

DETAILED DESCRIPTION OF EXAMPLE EMBODIMENTS

Figure 1:
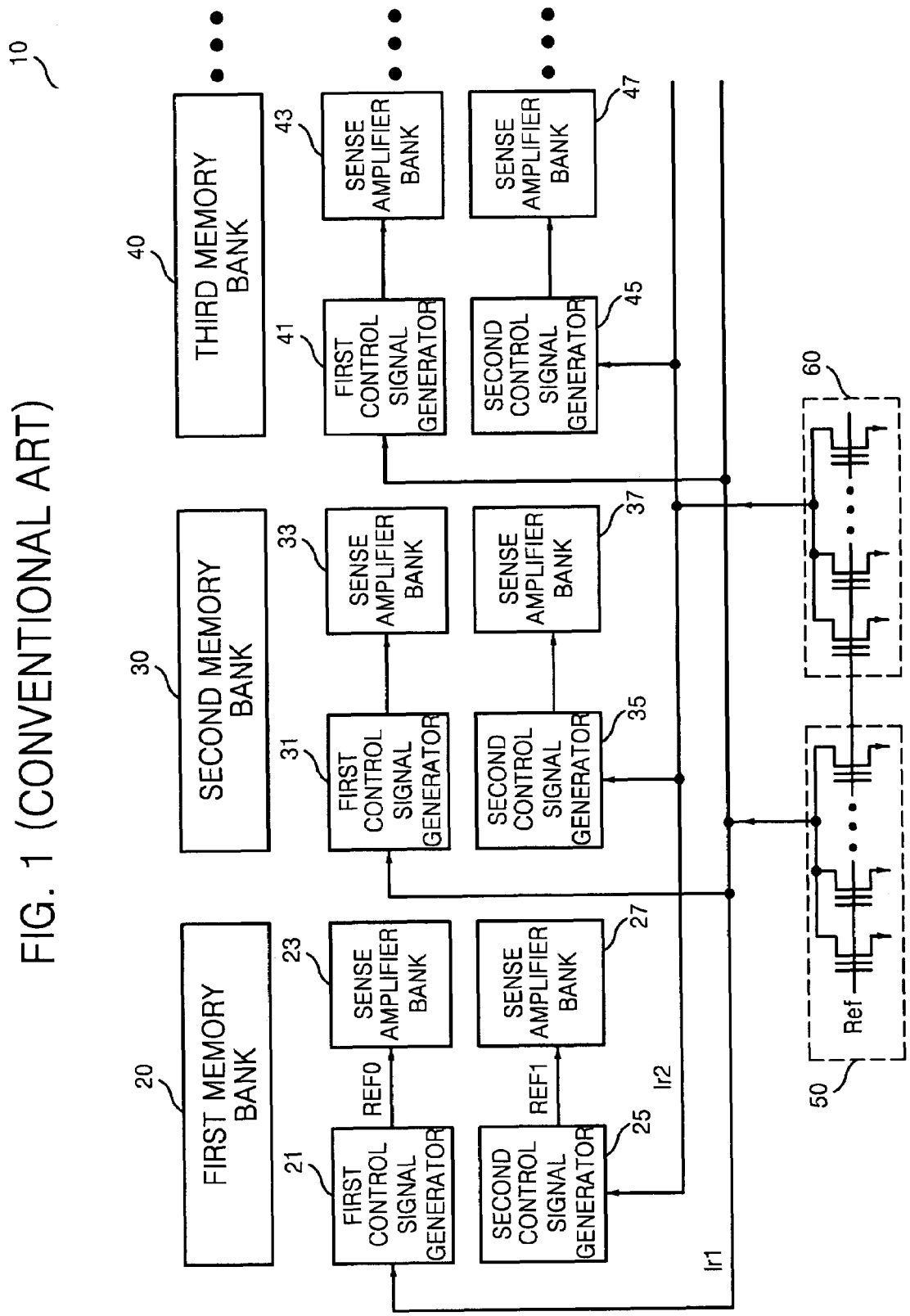
FIG. 1 illustrates a conventional semiconductor memory device including a sense amplifier.

Detailed illustrative example embodiments are disclosed herein. However, specific structural and functional details disclosed herein are merely representative for purposes of describing example embodiments. Example embodiments may, however, be embodied in many alternate forms and should not be construed as limited to the embodiments set forth herein.

Accordingly, while example embodiments are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
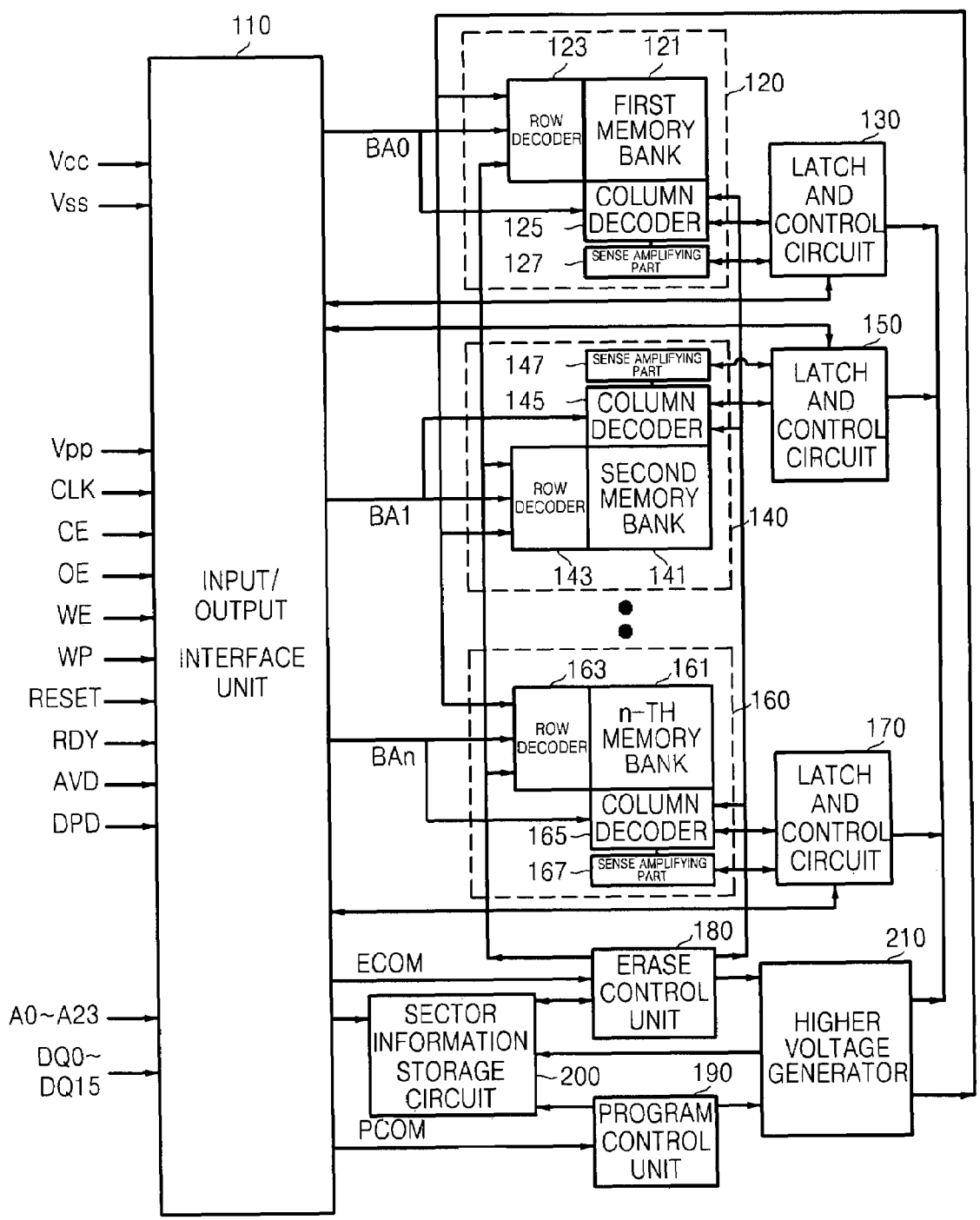
FIG. 2 is a functional block diagram illustrating a semiconductor memory device 100 according to an example embodiment.

FIG. 2 is a functional block diagram illustrating a semiconductor memory device 100 according to an example embodiment.

Figure 3:
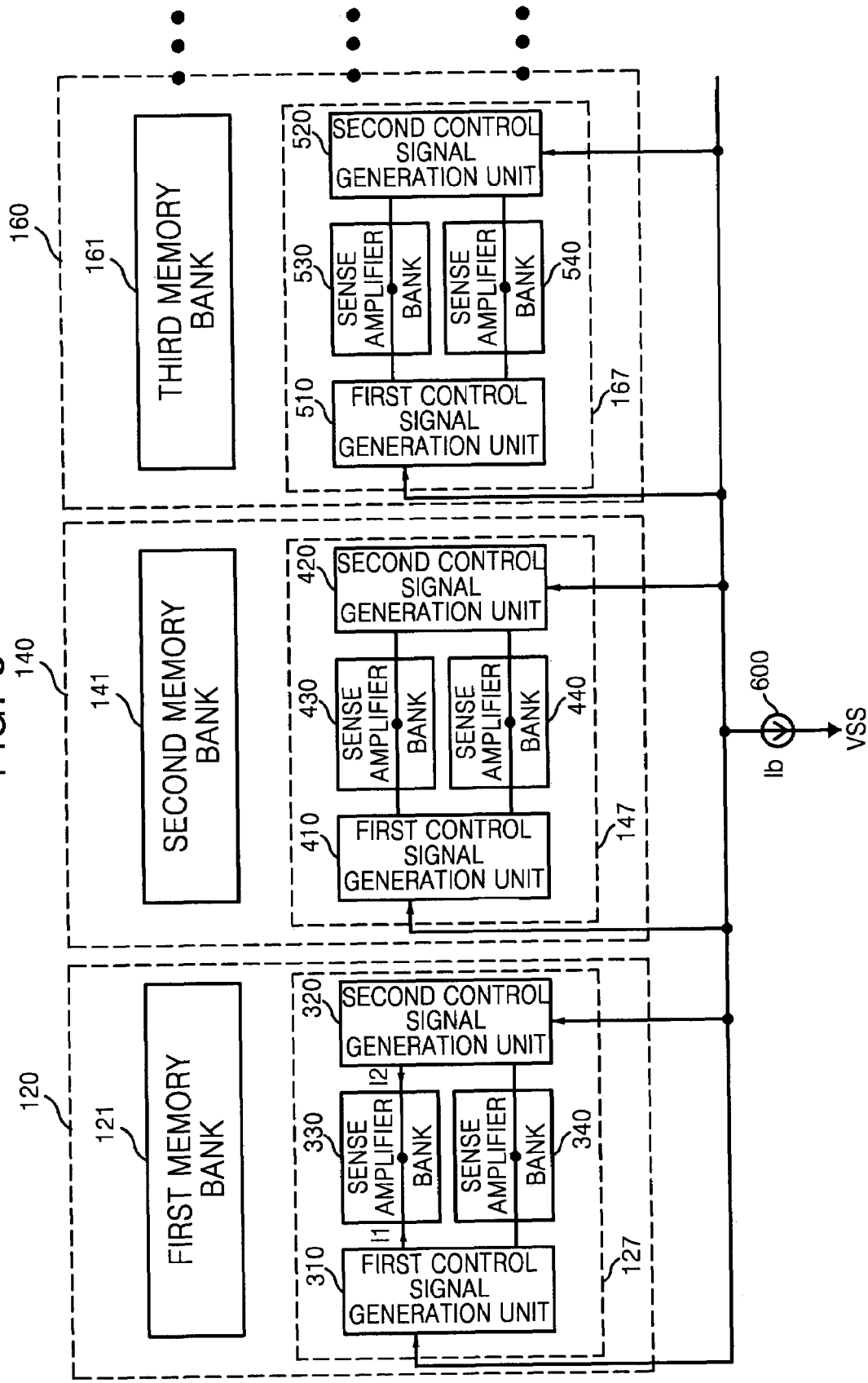
FIGS. 3 and 5 illustrate memory banks and sense amplifying parts in the semiconductor memory device illustrated in FIG. 2 according to another example embodiment.
Figure 5:
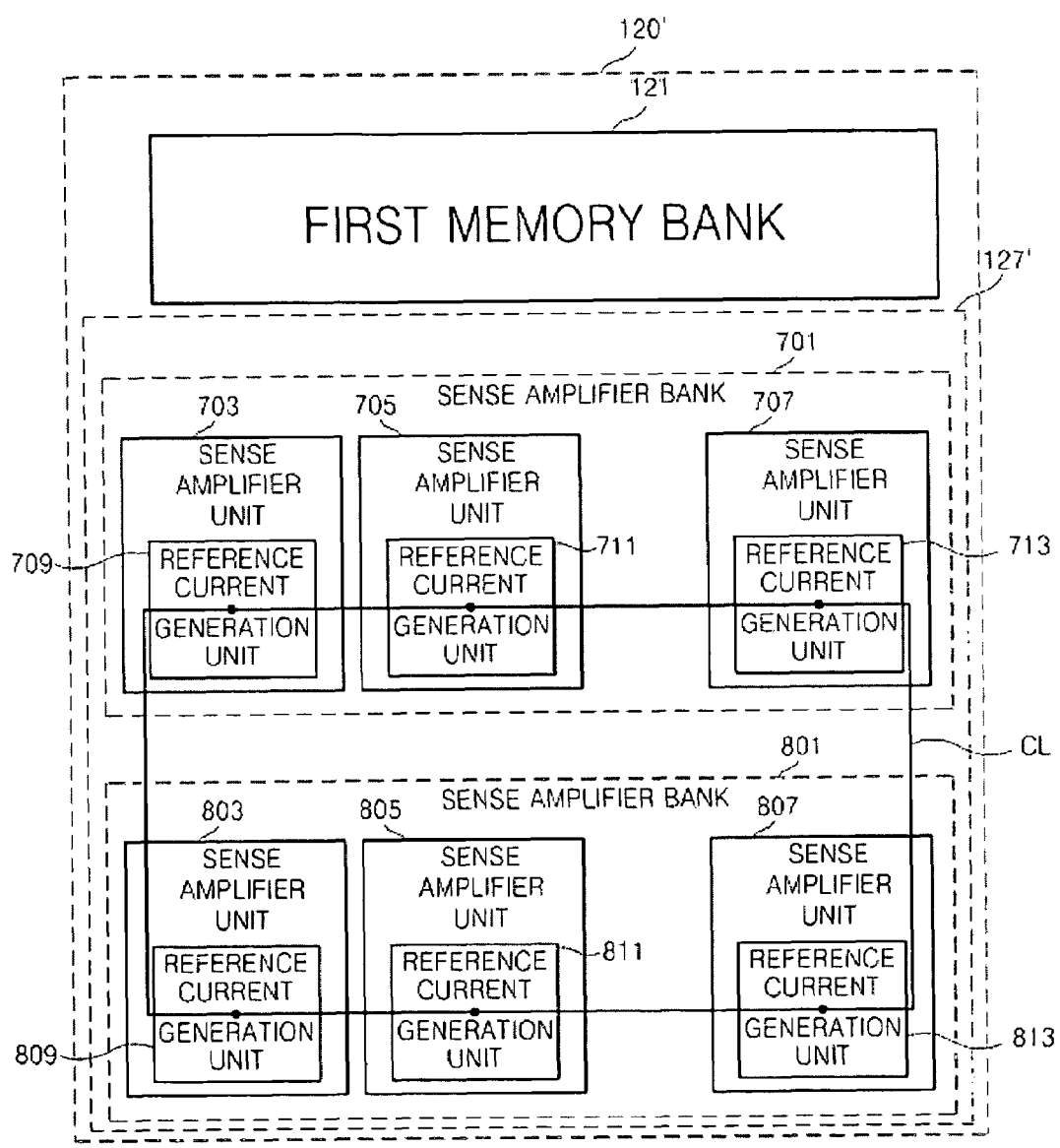

FIGS. 3 and 5 illustrate memory banks and sense amplifying parts in the semiconductor, memory device 100 illustrated in FIG. 2 according to another example embodiment.

Figure 4:
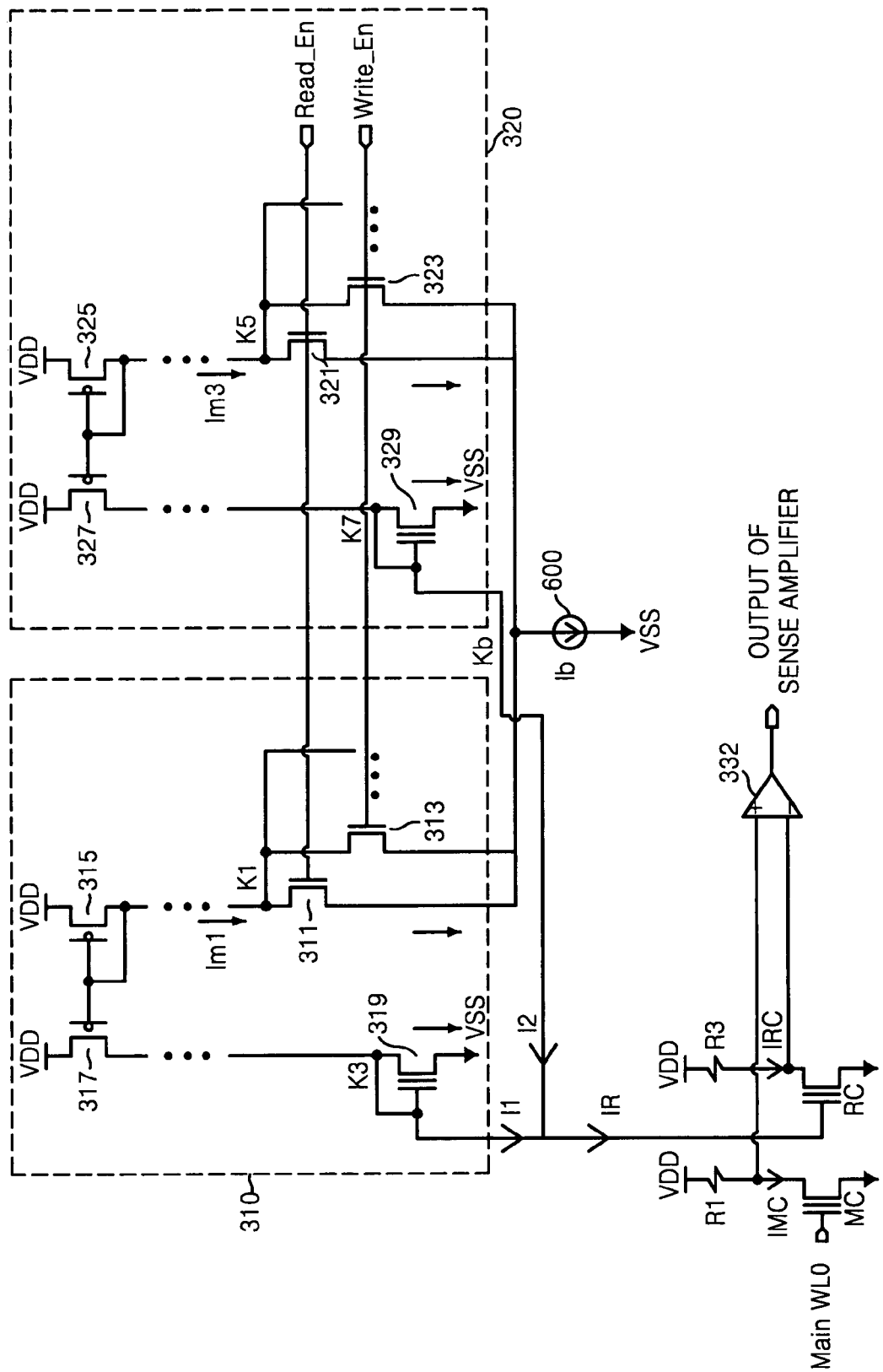
FIG. 4 is a circuit diagram illustrating the sense amplifying part illustrated in FIG. 3 according to another example embodiment.

FIG. 4 is a circuit diagram illustrating the sense amplifying part illustrated in FIG. 3 according to another example embodiment.

Figure 6:
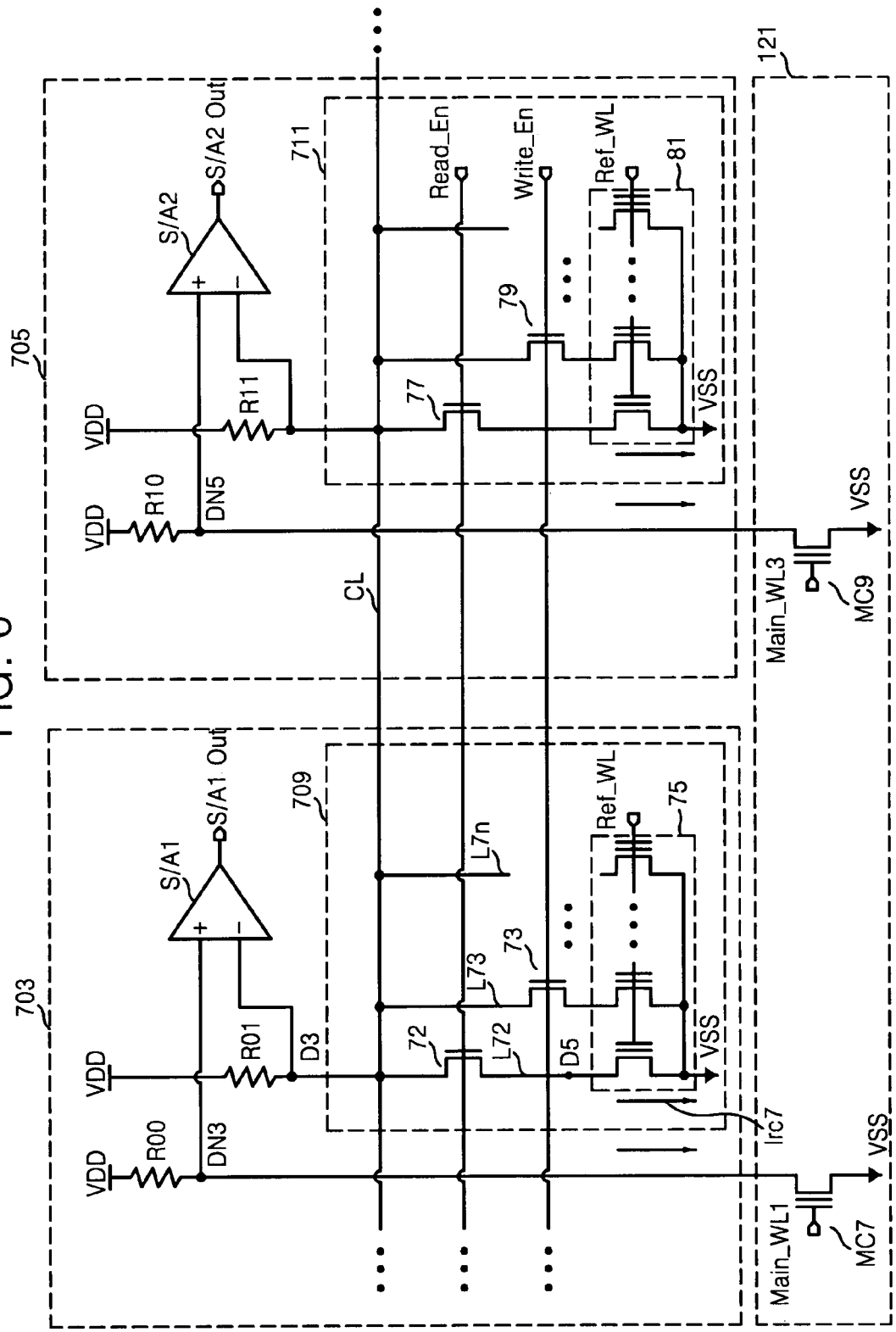
FIG. 6 is a circuit diagram illustrating the sense amplifying part of FIG. 5 according to another example embodiment.

FIG. 6 is a circuit diagram illustrating the sense amplifying part of FIG. 5 according to another example embodiment.

In the example embodiments of FIGS. 2 through 6, the semiconductor memory device 100 may include an input/output interface unit 110, first through n-th bank blocks 120, 140, and 160, a plurality of latch and control circuits 130, 150, and 170, an erase control unit 180, a program control unit 190, a sector information storage circuit 200, and a higher-voltage generation unit 210. In an example, the semiconductor memory device 100 may be implemented as a smart card, such as a multi-media card (MMC), a smart media card (SMC), a secure digital card (SDC), a memory stick, a compact flash card (CFC), etc.

In the example embodiment of FIG. 2, the input/output interface unit 110 may receive a plurality of signals (e.g., address signals A0 through A23, data signals DQ0 through DQ15, a chip enable signal CE, an output enable signal OE, a reset signal RESET, a write enable signal WE, a write protection signal WP, a clock signal CLK, a ready output signal RDY, a valid address signal AVD, a deep power down signal DPD, and first through third voltages Vcc, Vpp, and Vss). The input/output interface unit 110 may output bank addresses BA0 through BAn which may select at least one among from first through n-th banks 121, 141, and 161. In addition, the input/output interface unit 110 may output an erase command ECOM for controlling the erase control unit 180 and a program command PCOM for controlling the program control unit 190 in response to the plurality of signals. The input/output interface unit 110 may transmit data to and/or receive data from the latch and control circuits 130, 150, and 170.

In the example embodiments of FIGS. 2 through 6, the first through n-th bank blocks 120, 140, and 160 may include the first through n-th memory banks 121, 141, and 161, row decoders 123, 143, and 163, column decoders 125, 145, and 165, and sense amplifying parts 127, 147, and 167, respectively. The first memory bank 121 may include a plurality of non-volatile memory cells (e.g., flash EEPROM cells), each including a source, a drain, a floating gate, a control gate and a substrate. Each of the non-volatile memory cells may be configured to store data. The row decoder 123 and the column decoder 125 may receive and decode the bank address BA0 output from the input/output interface unit 110. The sense amplifying part 127 may sense and amplify data stored in a memory cell selected by the row decoder 123 and the column decoder 125.

Hereinafter, the sense amplifying part 127 will be described in detail with reference to the example embodiments of FIGS. 3 and 4. The sense amplifying part 127 may include a control signal generation unit and a plurality of sense amplifier banks 330 and 340.

In the example embodiments of FIGS. 3 and 4, the control signal generation unit may generate a plurality of control signals I1 and I2 in response to a bias current Ib and may include a first control signal generation unit 310 and a second control signal generation unit 320. The plurality of the control signals I1 and I2 may control a reference current IRC generated by a reference current generation unit RC. In an example, the sum of the plurality of the control signals I1 and I2 may be substantially the same as the bias current Ib.

In the example embodiments of FIGS. 3 and 4, the first control signal generation unit 310 may generate the first control signal I1 in response to the bias current Ib and may include a first transistor 311, a second transistor 313, a current mirror including a plurality of transistors 315 and 317, and a first memory cell 319. The first transistor 311 may be connected between a first terminal K1 and a bias terminal Kb and may be selectively enabled in response to a first enable signal (e.g., a read signal Read_En), thereby selectively connecting the first terminal K1 with the bias terminal Kb. The second transistor 313 may be connected between the first terminal K1 and the bias terminal Kb and may be selectively enabled in response to a second enable signal (e.g., a post program data verification signal Write_En), thereby selectively connecting the first terminal K1 with the bias terminal Kb. The current mirror may be connected between the first terminal K1 and a second terminal K3 and may be configured to mirror a current Im1 flowing in the first terminal K1, thereby generating the first control signal I1. The current mirror may include the third transistor 315 and the fourth transistor 317. The third transistor 315 may be connected between a first voltage supply VDD and the first terminal K1 and the fourth transistor 317 may be connected between the first voltage supply VDD and the second terminal K3. A gate and a source of the third transistor 315 and a gate of the fourth transistor 317 may be connected in common. The first memory cell 319 may include a source, a drain, a floating gate, a control gate, and a substrate and may be connected between the second terminal K3 and a second voltage supply VSS. The control gate and the drain of the first memory cell 319 may be connected in common.

In the example embodiment of FIGS. 3 and 4, the second control signal generation unit 320 may generate the second control signal I2 in response to the bias current Ib and may include a fifth transistor 321, a sixth transistor 323, a current mirror including a plurality of transistors 325 and 327, and a second memory cell 329. The fifth transistor 321 may be connected between a third terminal K5 and the bias terminal Kb and may be selectively enabled in response to the first enable signal (e.g., the read signal Read_En), thereby selectively connecting the third terminal K5 with the bias terminal Kb. The sixth transistor 323 may be connected between the third terminal K5 and the bias terminal Kb and may be selectively enabled in response to the second enable signal (e.g., the post program data verification signal Write_En), thereby selectively connecting the third terminal K5 with the bias terminal Kb. The current mirror may be connected between the third terminal K5 and a fourth terminal K7 and may be configured to mirror a current Im3 flowing in the third terminal K5, thereby generating the second control signal I2. The current mirror may include the seventh transistor 325 and the eighth transistor 327. The seventh transistor 325 may be connected between the first voltage supply VDD and the third terminal K5 and the eighth transistor 327 may be connected between the first voltage supply VDD and the fourth terminal K7. A gate and a source of the seventh transistor 325 and a gate of the eighth transistor 327 may be connected in common. The second memory cell 329 may include a source, a drain, a floating gate, a control gate, and a substrate and may be connected between the fourth terminal K7 and the second voltage supply VSS. The control gate and the drain of the second memory cell 329 may be connected in common.

In the example embodiment of FIGS. 3 and 4, the first sense amplifier bank 330 may include a reference current generation unit RC and a sense amplifier 332. The sense amplifier banks 330 and 340 may be positioned between the first control signal generation unit 310 and the second control signal generation unit 320. A "mismatch" or voltage inequality/disparity of reference signals respectively input to a plurality of sense amplifiers respectively included in the sense amplifier banks 330 and 340 may be reduced (e.g., prevented).

In an example, referring to conventional FIG. 1, the first sense amplifier bank 23 may be positioned only at one side of a control signal generation unit. A control signal input to a sense amplifier, which may be positioned farther from the control signal generation unit than other sense amplifiers included in the first sense amplifier bank 23, may become distorted. However, in the example embodiments of FIGS. 2 through 6, the first sense amplifier bank 330 corresponding to the first sense amplifier bank 23 may be positioned between the first control signal generation unit 310 and the second control signal generation unit 320, and therefore, distortion of the first control signal I1 (e.g., that may occur because a sense amplifier receiving the first control signal I1 is farther from the first control signal generation unit 310 than other sense amplifiers in the first sense amplifier bank 330) may be reduced and/or prevented. Accordingly, data stored in memory cells may be sensed more reliably.

In the example embodiment of FIGS. 3 and 4, the reference current generation unit RC may generate the reference current IRC in response to a current control signal IR corresponding to the sum of currents of the first control signal I1 and the second control signal I2. In an example, the reference current generation unit RC may be implemented by at least one non-volatile memory device which may be gated in response to the current control signal IR and may generate the reference current IRC.

In the example embodiment of FIGS. 3 and 4, the sense amplifier 332 may sense and amplify data stored in a memory cell MC based on the reference current IRC and a current IMC that flows in a bit line connected with the memory cell MC. For example, the sense amplifier 332 may output a first logic level (e.g., a higher logic level or logic "1") if the reference current IRC is greater than the current IMC that flows in the bit line connected with the memory cell MC and may output a second logic level (e.g., a lower logic level or logic "0") if the reference current IRC is less than the current IMC.

In the example embodiment of FIGS. 3 and 4, the semiconductor memory device 100 may further include a bias current generation unit 600. The bias current generation unit 600 may be implemented by a current source that generates the bias current Ib and/or a current generation circuit including at least one non-volatile memory device (not shown) and gated in response to a bias current generation signal (not shown) to generate the bias current Ib.

In another example embodiment, a plurality of sense amplifying parts 127, 147, and/or 167 may share the bias current generation unit 600, thereby reducing (e.g., preventing) an occurrence of a "mismatch" or voltage inequality of reference signals input to sense amplifiers included in the sense amplifying parts 127, 147, and/or 167.

A sense amplifying part 127' included in a first memory bank block 120' according will now be described with reference to the example embodiments of FIGS. 5 and 6 below.

In the example embodiments of FIGS. 5 and 6, the first memory bank block 120' may include one or more sense amplifier banks 701 and 801, and may include a plurality of sense amplifier units 703 through 707 and 803 through 807, respectively. The sense amplifier unit 703 may sense and amplify data stored in a memory cell MC7 selected by the row decoder 123 and the column decoder 125. The sense amplifier unit 703 may include a common line CL, a current source 709, and a sense amplifier S/A1.

In the example embodiments of FIGS. 5 and 6, the current source 709 may form a current path between the common line CL and the second voltage supply VSS in response to the first enable signal (e.g., a read signal Read_En) or the second enable signal (e.g., a post program data verification signal Write_En) and a gating signal Ref_WL. The current source 709 may include one or more current lines (e.g., L72, L73, and L7n) connected between the common line CL and the second voltage supply VSS.

In the example embodiments of FIGS. 5 and 6, the current line L72 may include a reference current generation unit 75 and a switch 72. The reference current generation unit 75 may be connected between a first node D7 and the second voltage supply VSS and may be gated in response to the gating signal Ref_WL, thereby generating a reference current Irc7. In an example, the reference current generation unit 75 may be implemented by at least one non-volatile memory device. The switch 72 may be connected between a second node D3 and the second voltage supply VSS and may be gated in response to the first enable signal Read_En, thereby transmitting the reference current Irc7 to the common line CL. In an example, the switch 72 may be implemented by at least one MOS transistor.

In the example embodiments of FIGS. 5 and 6, the sense amplifier S/A1 may sense and amplify data stored in the memory cell MC7 based on a signal (e.g., a voltage of a third node DN3) on a bit line, which may be connected with the corresponding memory cell MC7 among a plurality of memory cells included in the first memory bank 121, and a signal (e.g., a voltage of the second node D3) on the common line CL. For example, the sense amplifier S/A1 may output the first logic level (e.g., a higher logic level or logic "1") if a voltage of the third node DN3 is greater than a voltage of the second node D3 and may output the second logic level (e.g., a lower logic level or logic "0") if the voltage of the third node DN3 is not greater than the voltage of the second node D3. Accordingly, a plurality of sense amplifiers S/A1 and S/A2 may share the plurality of the current sources 709 and 711, thereby reducing (e.g., preventing) an occurrences of mismatches or voltage inequalities of reference signals (e.g., voltages of the second node D3) input to the plurality of the sense amplifiers S/A1 and S/A2.

In the example embodiments of FIGS. 5 and 6, because the sense amplifying part 127' may include a plurality of the reference current generation unit 75 and 81, data sensing may be performed relatively accurately irrespective of whether a defect occurs in one of the reference current generation unit 75 and 81, and a larger sensing margin may be obtained.

In the example embodiments of FIGS. 2 through 6, the latch and control circuit 130 may latch the data sensed by the sense amplifying part 127 and may transmit the latched data to the input/output interface unit 110. The erase control unit 180 may output an erase control signal in response to the erase command ECOM and control signals (e.g., a busy signal and a ready signal) output from the sector information storage circuit 200. The program control unit 190 may output a program control signal in response to the program command PCOM and the control signals output from the sector information storage circuit 200. The sector information storage circuit 200 may store information on sectors of each of the first through n-th memory banks 121, 141, and 161. For example, the sector information storage circuit 200 may include information regarding a sector to be erased during an erase operation of the semiconductor memory device 100, such as information on erase or non-erase of a sector, and may provide the sector information to the erase control unit 180 and the program control unit 190. The higher voltage generator 210 may receive the erase control signal and/or the program control signal and may generate a higher voltage to program or erase data to or from the first memory bank 121.

Figure 7:
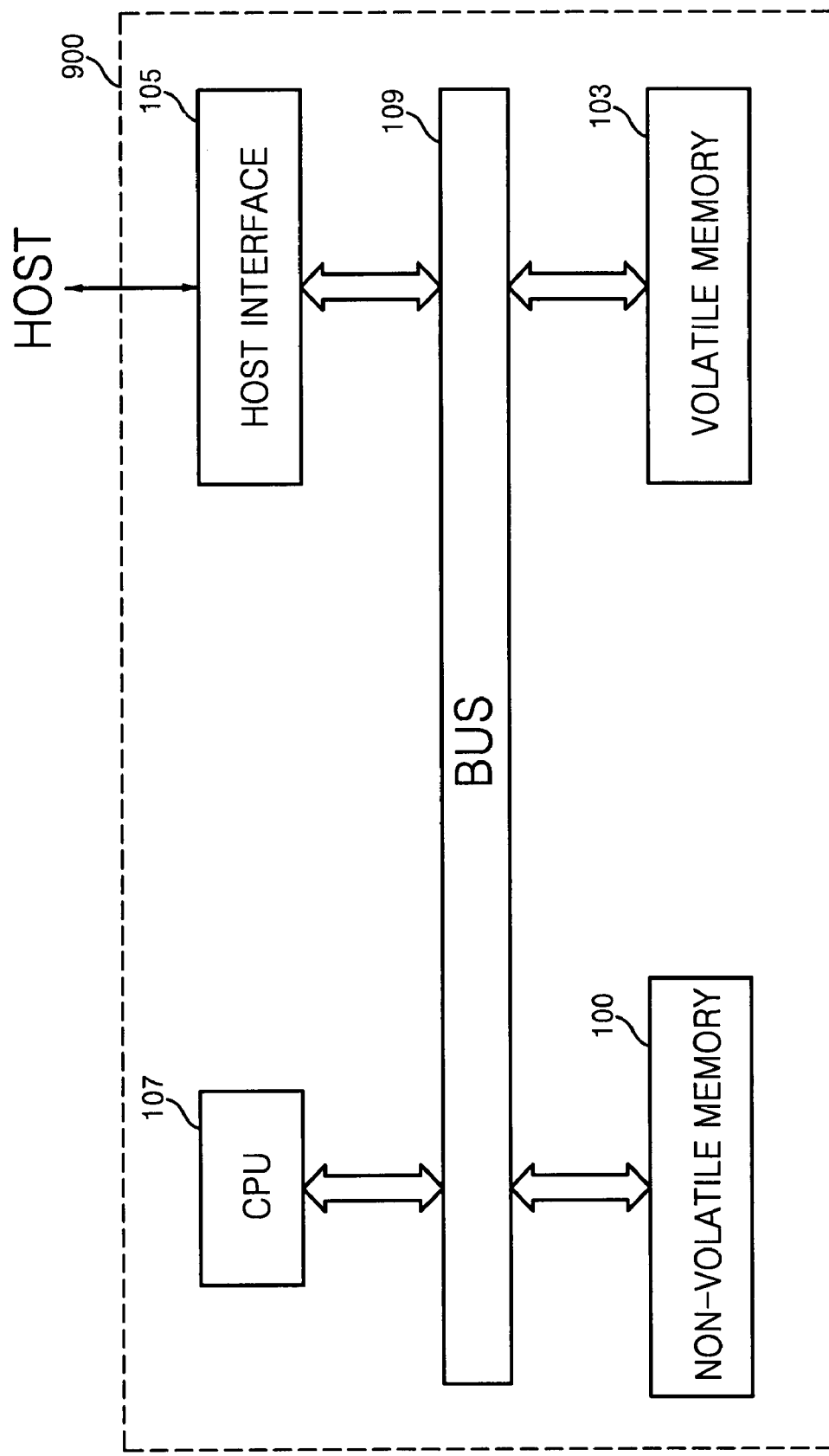
FIG. 7 illustrates a memory card according to an example embodiment.

FIG. 7 illustrates a memory card 900 according to an example embodiment. In the example embodiment of FIG. 7, the memory card 900 may include a non-volatile memory 100

(e.g., corresponding to the semiconductor memory device 100 of FIG. 2), a volatile memory 103, a host interface 105, a central processing unit (CPU) 107, and a bus 109. In an example, the memory card 900 may be implemented as a smart card, such as an MMC, an SMC, an SDC, a memory stick, a CFC, etc.

In the example embodiment of FIG. 7, the non-volatile memory 100 may be connected with the bus 109. The non-volatile memory 100 may be configured to store and/or output data input through the host interface 105 from a host, or may alternatively be configured to store an operating program (e.g., an operating system, such as a BIOS) to operate the memory card 900. Example structure and operation of the non-volatile memory 100 have been described in detail above with reference to FIGS. 2 through 6, and as such a further description thereof has been omitted for the sake of brevity.

In the example embodiment of FIG. 7, the volatile memory 103 may be connected to the bus 109. The volatile memory 103 may be configured to store and/or output data input through the host interface 105 from the host, or alternatively may be configured to store an operating program (e.g., an operating system, such as a BIOS) to operate the memory card 900. In an example, the volatile memory 103 may be implemented as a synchronous random access memory (SRAM), a dynamic random access memory (DRAM), etc.

In the example embodiment of FIG. 7, the host interface 105 may transmit data input from the host to the non-volatile memory 100 and/or the volatile memory 103 through the bus 109. The host interface 105 may also transmit data stored in the semiconductor memory device 100 and/or the volatile memory 103 to the host. The CPU 107 may transmit a memory command (e.g., a data write signal, a data read signal, etc.) to the non-volatile memory 100 and/or the volatile memory 103 based on a memory command (e.g., a write or read command) received from the host.

Figure 8:
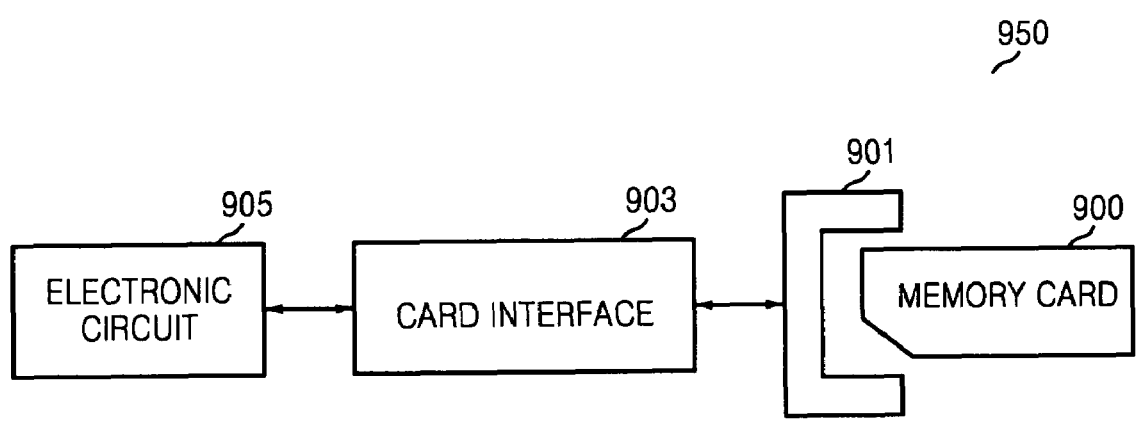
FIG. 8 is a functional block diagram illustrating an electronic device including the memory card illustrated in FIG. 7 according to another example embodiment.

FIG. 8 is a functional block diagram illustrating an electronic device 950 including the memory card 900 illustrated in FIG. 7 according to another example embodiment.

FIGS. 9A through 9J illustrate electronic devices including the memory card 900 illustrated in FIG. 7 according to example embodiments.

Figure 9A:
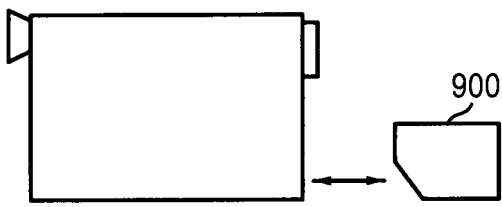
FIGS. 9A through 9J illustrate electronic devices including the memory card illustrated in FIG. 7 according to example embodiments.
Figure 9F:
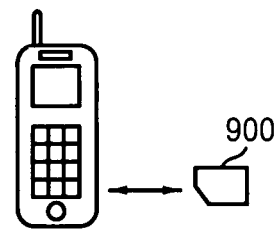
Figure 9B:
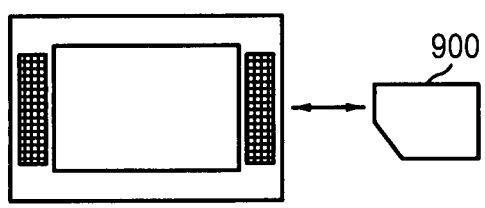
Figure 9G:
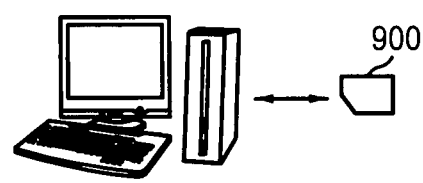
Figure 9C:
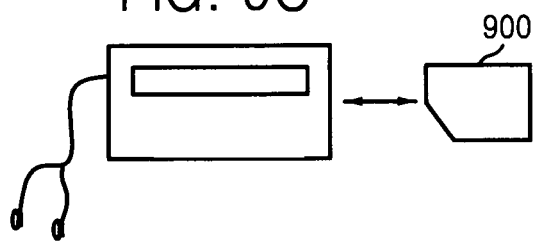
Figure 9H:
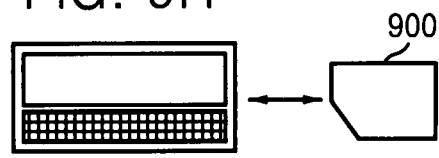
Figure 9D:
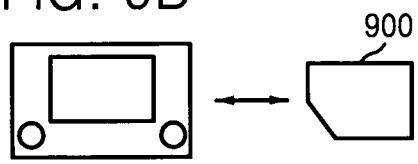
Figure 9I:
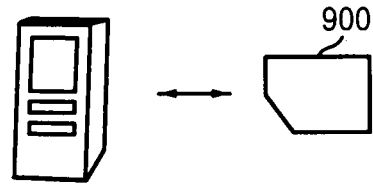
Figure 9E:
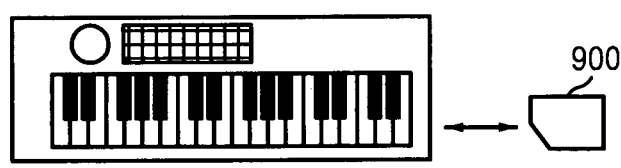
Figure 9J:
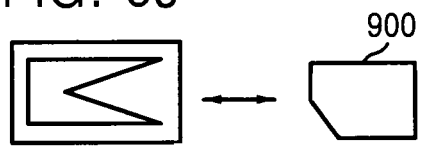

In the example embodiments of FIGS. 8 through 9J, the electronic device 950 may be embodied as a video camera as illustrated in FIG. 9A, a television illustrated as illustrated in FIG. 9B, an MP3 as illustrated in FIG. 9C, a game player as illustrated in FIG. 9D, an electronic musical instrument as illustrated in FIG. 9E, a portable terminal as illustrated in FIG. 9F, a personal computer (PC) as illustrated in FIG. 9G, a personal digital assistant (PDA) as illustrated in FIG. 9H, a voice recorder as illustrated in FIG. 9I and/or a PC card as illustrated in FIG. 9J. The memory card 900 may be electrically connected to a memory slot 901 and may be configured to store data (e.g., video or audio data) output from an electronic circuit 905 and/or to transmit stored data to the electronic circuit 905 through a card interface 903.

In the example embodiments of FIGS. 8 through 9J, in an example, if the electronic device 950 corresponds to the video camera illustrated in FIG. 9A, the electronic circuit 905 may include a CMOS image sensor (CIS), an image processor, and a digital signal processor. Data (e.g., video or audio data) generated in the electronic circuit 905 may be transmitted to the memory card 900 through the card interface 903.

FIG. 10 is a flowchart illustrating a data sensing process according to an example embodiment. For example purposes only, the data sensing process of FIG. 10 will now be described with reference to FIGS. 3, 4, and 10.

In the example embodiment of FIG. 10, the bias current generation unit 600 may generate a bias current Ib (at S10). The control signal generation units 310 and 320 may generate a plurality of control signals I1 and I2 in response to the bias current Ib (at S20). The reference current generation unit RC may generate a reference current IRC in response to the plurality of the control signals I1 and I2 (at S30). The sense amplifier 332 may sense data stored in the memory cell MC based on the reference current IRC and a current IMC flowing in a bit line connected with the memory cell MC (at S40).

In another example embodiment, a plurality of sense amplifiers may share a bias signal generation unit, and may be configured to reduce an occurrence of "mismatches" or voltage inequalities between reference signals respectively input to the plurality of sense amplifiers. Further, in an example, because a sense amplifier bank may be positioned between control signal generation units, the mismatch of the reference signals may be reduced (e.g., prevented). Also, the plurality of sense amplifiers may share a plurality of reference current generation units, which may likewise reduce a mismatch of the reference signals. Also, even if a defect occurs in one or more of the reference current generation units, a data sensing operation may still be performed.

Example embodiments being thus described, it will be obvious that the same may be varied in many ways. For example, it is understood that the above-described first and second logic levels may correspond to a higher level and a lower logic level, respectively, in an example embodiment. Alternatively, the first and second logic levels/states may correspond to the lower logic level and the higher logic level, respectively, in other example embodiments.

Such variations are not to be regarded as a departure from the spirit and scope of example embodiments, and all such modifications as would be obvious to one skilled in the art are intended to be included within the scope of the following claims.

What is claimed is:

1. A semiconductor memory device comprising:
   a control signal generation unit configured to generate a plurality of control signals in response to a bias current;
   a reference current generation unit configured to generate a reference current in response to the plurality of control signals; and
   a sense amplifier configured to sense and amplify data stored in a given memory cell based on the reference current and a current on a bit line connected to the memory cell,
   wherein the control signal generation unit includes
       a first control signal generation unit configured to generate a first control signal among the plurality of control signals in response to the bias current, and
       a second control signal generation unit configured to generate a second control signal among the plurality of control signals in response to the bias current,
   wherein the sense amplifier is positioned between the first control signal generation unit and the second control signal generation unit,
   wherein the first control signal generation unit includes a first current mirror that is connected to inputs for a first enable signal and a second enable signal and mirrors the bias current in response to one of the first enable signal and the second enable signal, and
   wherein the second control signal generation unit includes a second current mirror that is connected to the inputs for the first enable signal and the second enable signal and mirrors the bias current in response to one of the first enable signal and the second enable signal, wherein the first enable signal and the second enable signal are independent and exclusively enabled.

2. The semiconductor memory device of claim 1, wherein the first control signal generation unit outputs the first control signal by mirroring the bias current, and wherein the second control signal generation unit outputs the second control signal by mirroring the bias current.

3. The semiconductor memory device of claim 1, wherein the sense amplifier is one of a plurality of sense amplifiers, each of the plurality of sense amplifiers positioned between the first control signal generation unit and the second control signal generation unit.

4. The semiconductor memory device of claim 1, wherein a sum of currents of the plurality of control signals is substantially equal to the bias current.

5. The semiconductor memory device of claim 1, wherein the reference current generation unit includes at least one non-volatile memory, which is gated in response to the plurality of control signals and generates the reference current.

6. The semiconductor memory device of claim 5, wherein the non-volatile memory is a flash memory.

7. A smart card, comprising:
a central processing unit (CPU); and
the semiconductor memory device of claim 1,
wherein the CPU controls an exchange of data between an external host and the semiconductor memory device.

8. An electronic device, comprising:
a card interface;
a card slot connected to the card interface; and
the smart card of claim 7,
wherein the smart card is electronically connected to the card slot.

* * * * *